(12) United States Patent
Basker et al.

(10) Patent No.: US 8,871,626 B2
(45) Date of Patent: Oct. 28, 2014

(54) FINFET WITH VERTICAL SILICIDE STRUCTURE

(71) Applicant: International Business Machines Corporation, Armonk, NY (US)

(72) Inventors: Veeraraghavan S. Basker, Schenectady, NY (US); Chung-Hsun Lin, White Plains, NY (US); Tenko Yamashita, Schenectady, NY (US); Chun-Chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 6 days.

(21) Appl. No.: 13/649,284

(22) Filed: Oct. 11, 2012

(65) Prior Publication Data

US 2013/0154006 A1    Jun. 20, 2013

Related U.S. Application Data

(63) Continuation-in-part of application No. 13/330,746, filed on Dec. 20, 2011, now Pat. No. 8,445,334.

(51) Int. Cl.
*H01L 27/12* (2006.01)
*H01L 21/84* (2006.01)

(52) U.S. Cl.
USPC ........... 438/597; 257/192; 257/245; 257/278; 257/368; 257/347; 438/197

(58) Field of Classification Search
USPC ........... 257/192, 245, 278, 368; 438/197, 597
See application file for complete search history.

(56) References Cited

U.S. PATENT DOCUMENTS

| | | |
|---|---|---|
| 6,265,291 B1 | 7/2001 | Yu et al. |
| 6,690,072 B2 | 2/2004 | Cabral, Jr. et al. |
| 6,972,250 B2 | 12/2005 | Cabral, Jr. et al. |
| 7,179,745 B1 | 2/2007 | Waite et al. |
| 7,282,766 B2 | 10/2007 | Okuno |
| 7,396,710 B2 | 7/2008 | Okuno |
| 7,582,567 B1 | 9/2009 | Syau et al. |
| 7,851,865 B2 | 12/2010 | Anderson et al. |

(Continued)

OTHER PUBLICATIONS

Ghani, T., et al., "A 90 nm High Volume Manufacturing Logic Technology Featuring Novel 45 nm Gate Length Strained Silicon CMOS Transistors," IEDM 2003, p. 978-980.

(Continued)

*Primary Examiner* — Matthew W Such
*Assistant Examiner* — David Spalla
(74) *Attorney, Agent, or Firm* — Cantor Colburn LLP; Vazken Alexanian (57) ABSTRACT

FinFETS and methods for making FinFETs with a vertical silicide structure. A method includes providing a substrate with a plurality of fins, forming a gate stack above the substrate wherein the gate stack has at least one sidewall and forming an off-set spacer adjacent the gate stack sidewall. The method also includes growing an epitaxial film which merges the fins to form an epi-merge layer, forming a field oxide layer adjacent to at least a portion of the off-set spacer and removing a portion of the field oxide layer to expose a portion of the epi-merge-layer. The method further includes removing at least part of the exposed portion of the epi-merge-layer to form an epi-merge sidewall and an epi-merge spacer region and forming a silicide within the epi-merge sidewall to form a silicide layer and two silicide sidewalls.

6 Claims, 8 Drawing Sheets

(56) References Cited

U.S. PATENT DOCUMENTS

| | | | |
|---|---|---|---|
| 8,633,515 B2* | 1/2014 | Orlowski et al. | ............ 257/192 |
| 2006/0228862 A1 | 10/2006 | Anderson et al. | |
| 2006/0261411 A1 | 11/2006 | Hareland et al. | |
| 2008/0067613 A1 | 3/2008 | Anderson et al. | |
| 2008/0230852 A1 | 9/2008 | Yu et al. | |
| 2008/0237712 A1 | 10/2008 | Wei et al. | |
| 2009/0065817 A1 | 3/2009 | Cartier et al. | |
| 2009/0152638 A1 | 6/2009 | Belyansky et al. | |
| 2009/0212366 A1 | 8/2009 | Chang et al. | |
| 2009/0224321 A1 | 9/2009 | Tsuchiya | |
| 2009/0280629 A1 | 11/2009 | Tan et al. | |
| 2009/0321841 A1 | 12/2009 | Hoentschel et al. | |
| 2011/0062518 A1 | 3/2011 | Chan et al. | |
| 2011/0101455 A1 | 5/2011 | Basker et al. | |
| 2011/0223736 A1 | 9/2011 | Lin et al. | |
| 2011/0284967 A1* | 11/2011 | Cheng et al. | ................ 257/368 |
| 2011/0291188 A1 | 12/2011 | Cheng et al. | |

OTHER PUBLICATIONS

Horstmann, M., et al., "Integration and Optimization of Embedded SiGe, Compressive and Tensile Stressed Liner Films, and Stress Memorization in Advanced SOI CMOS Technologies," IEDM 2005, p. 233-236.

Kawasaki, H., et al., "Challenges adn Solutions of FinFET Integration in an SRAM Cell and a Logic Circuit for 22 nm node and beyond", IEDM 2009, p. 289-292.

Shang, H., et al., "Investigation of FinFET devices for 32 nm Technologies and Beyond," IEEE 2006 Symposium on VLSI Technology Digest of Technical Papers, Oct. 2006, p. 54-55.

Yagishita, A. et al., "FinFET SRAM Process Technology for hp32 nm Node and Beyond," IEEE International Conference on Intergrated Circuit Design and Technology, 2007, ICICDT07, p. 1-4.

Bangsaruntip, S., et al., "High Performance and High Uniform Gate-All-Around Silicon Nanowire MOSFETs with Wire Size Dependent Scaling," IEDM 2009, p. 297-300.

Yang, H.S., et al., "Dual Stress Liner for High Performance sub-45nm Gate Length SOI CMOS Manufacturing," IEDM 2004, p. 1075-1077.

International Search Report and Opinion for International Application No. PCT/US12/62964; International filing date: Nov. 1, 2012; Date of mailing Jan. 9, 2013; 18 pages.

* cited by examiner

FINFET WITH VERTICAL SILICIDE STRUCTURE

CROSS-REFERENCE TO RELATED APPLICATION

This application is a continuation in part of U.S. patent application Ser. No. 13/330,746, filed Dec. 20, 2011, the disclosure of which is incorporated by reference herein in its entirety.

BACKGROUND

The present invention generally relates to a non-planar Metal Oxide Semiconductor Field Effect Transistors (MOSFETs) made on semiconductor-on-insulator (SOI) substrates. In particular, the invention relates to FinFETs with a merged source drain region in which the merged region includes a vertical silicide structure.

As FinFETs continue to be made smaller, the space available for the silicide used for the source and drain also continues to decrease resulting in the contact resistance of the silicide contacts increasing.

SUMMARY

Embodiments of the disclosure include a method of forming a MOSFET, the method includes providing a substrate with a plurality of fins, forming a gate stack above the substrate wherein the gate stack has at least one sidewall and forming an off-set spacer adjacent the gate stack sidewall. The method also includes growing an epitaxial film which merges the fins to form an epi-merge layer, forming a field oxide layer adjacent to at least a portion of the off-set spacer, and removing a portion of the field oxide layer to expose a portion of the epi-merge-layer. The method further includes removing at least part of the exposed portion of the epi-merge-layer to form an epi-merge sidewall and an epi-merge spacer region and forming a silicide within the epi-merge sidewall to form a silicide layer and two silicide sidewalls.

Embodiments of the disclosure also include a MOSFET including a substrate with a plurality of fins and a buried insulator region, the substrate having an epi-merge region and a gate stack above the buried insulator region wherein the gate stack has at least one sidewall. The MOSFET also includes an off-set spacer adjacent the gate stack sidewall, a field oxide layer adjacent at least a portion of the off-set spacer and above the below the epi-merge region of the substrate and a silicide structure within the epi-merge region having a silicide layer and two silicide sidewalls.

Embodiments of the disclosure further include a MOSFET having a source, a drain, and a gate stack interposed between the source and the drain. The MOSFET also includes a channel under the gate stack and interposed between the source and the drain and a silicide structure on the source and drain wherein in a portion of the silicide structure is perpendicular to the channel.

Other characteristics and advantages of the invention will become obvious in combination with the description of accompanying drawings, wherein the same number represents the same or similar parts in all figures.

BRIEF DESCRIPTION OF THE SEVERAL VIEWS OF THE DRAWINGS

FIG. 8B illustrates a cross section of a MOSFET after a vertical silicide is formed according to an embodiment of the

DETAILED DESCRIPTION

In accordance with exemplary embodiments a method is provided for creating a FinFET by recessing a field oxide layer and epi-merge region and forming a vertical silicide structure in the recessed epi-merge region. The method will be described in conjunction with FIGS. 1-8.

The disclosure also includes a structure of a FinFET having an epi-merge field area which is recessed and a vertical silicide structure. A detailed description of the invention is made in combination with the following embodiments. It should be noted that that reference numbers are merely reference numbers and, thus, do not necessarily restrict the method to the numerical order of the reference numbers.

Figure 1:
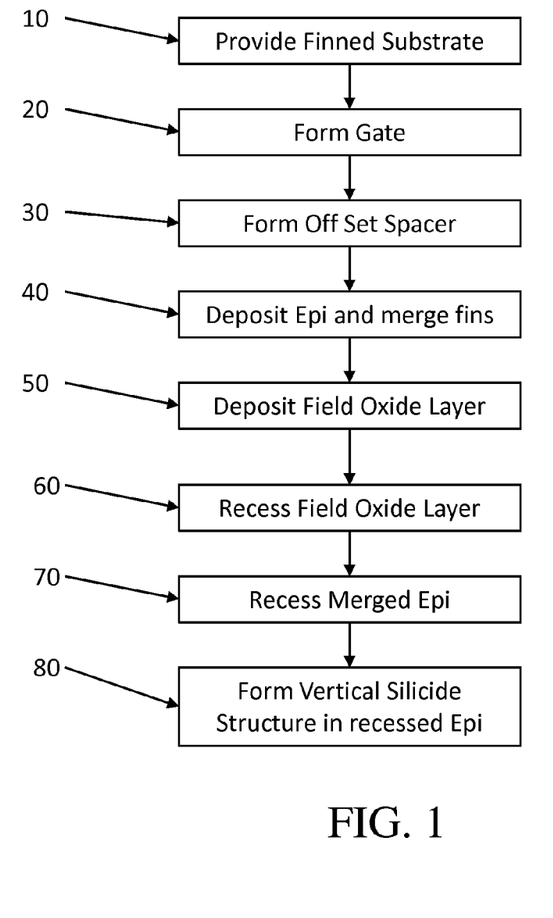
FIG. 1 is a flow chart of a method of making a MOSFET according to an embodiment of this disclosure.

FIG. 1 is a flow chart illustrating a method of creating a high performance FinFET with a recessed epi-merge field region according to an exemplary embodiment. Block 10 illustrates providing a substrate with fins, block 20 illustrates forming a gate stack; block 30 illustrates forming off-set spacer adjacent to the gate stack; block 40 illustrates growing an epitaxial layer which merges the fins to form an epi-merge layer; block 50 illustrates depositing a field oxide layer; block 60 illustrates recessing the field oxide layer; block 70 illustrates recessing the epi-merge region; and block 80 illustrates forming a vertical silicide structure with the epi-merge layer. Each of the above operations will be discussed in further detail below.

Figure 2:
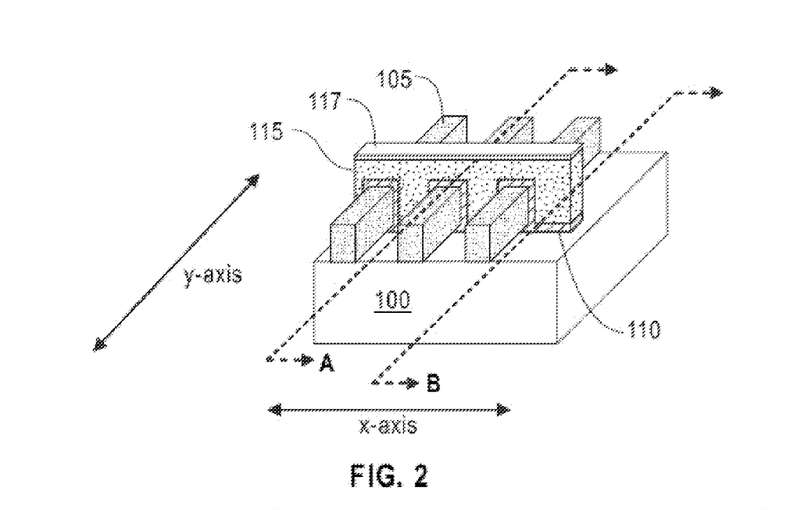
FIG. 2 illustrates a starting point of a method according to an embodiment of the disclosure in which a substrate with fins and a gate stack is provided. Dotted lines represent cross sections along the y-axis further illustrated in FIGS. 2A and 2B.

Creating a high performance FinFET with recessed epi-merge region starts by providing a substrate 100 as shown in FIG. 2. The substrate can be a semiconductor-on-insulator substrate (SOI). SOI substrates generally include three layer: a bottom bulk semiconductor section, a buried insulator or oxide section (often referred to as "BOX"), and a semiconductor layer on top of the BOX. In this application, the semiconductor layer on top of the BOX has been etched to form fins 105. Thus, in FIG. 2, reference numeral 100 depicts both the bulk semiconductor layer and the BOX of the substrate, with the SOI fins 105 disposed thereon.

Continuing with FIG. 2, typically, the insulating layer of the BOX is an oxide, preferably silicon dioxide. The semiconductor on insulator layer, which has been etched to form fins 105, can be silicon, silicon doped with conventional 'n' or 'p' dopants, silicon germanium (SiGe), silicon germanium carbon (SiGeC), silicon carbon (SiC), III-V semiconductor compounds (for example $In_{1-x}Ga_xAs$, InP, GaAs) or other variations. The height of the fins 105 can range from about 10 nm to about 80 nm and ranges there between, but is preferably about 30 nm. The width of the fins can range from about 5 nm to about 50 nm and ranges there between, but is preferably about 10-12 nm. The pitch of the fins can range from about 30 nm to about 150 nm and ranges there between, but is preferably about 40 nm.

A gate stack is formed on the substrate 100. The gate stack includes two parts: a metal gate 115 and a high dielectric constant material 110. FIG. 2 shows the SOI substrate 100 with a metal gate 115 and high dielectric constant film 110 (herein referred to as "high-k") formed using conventional patterning techniques.

Figure 2A:
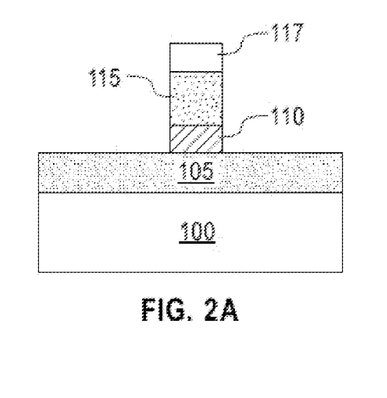
FIG. 2A illustrates a cross section of a starting point of a method according to an embodiment of the invention in which a substrate with fins and a gate stack is provided. The cross-section along the y-axis following a fin as it goes under the gate stack.

From FIG. 2 it can be seen that the gate stack runs roughly perpendicular to the fins 105 and crosses over the fins 105. The dotted lines represent areas in which cross sections of FinFET are taken along the y-axis. For example, FIG. 2A is a cross section taken along dotted line A of the substrate 100 which follows a fin 105 through the intersection of the fin 105 with gate stack. In FIG. 2A, the cross section shows substrate 100, fin 105, high-k 110 over the fin 105, and the metal gate 115 over the high-k 110. Optionally, there is a hard mask 117 material remaining over the metal gate 115.

Figure 2B:
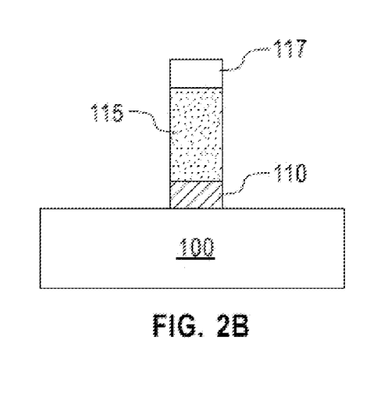
FIG. 2B illustrates a cross section of a starting point of a method according to an embodiment of the invention in which a substrate with fins and a gate stack is provided. The cross-section is through the gate-stack along the y-axis according to an embodiment of the invention.

Dotted line B of FIG. 2 is also a cross section along the y-axis of the substrate 100, but this time in an area in which there is only a gate stack. FIG. 2B shows the cross section taken along line B. In FIG. 2B there is the substrate 100, high-k material 110 and metal gate 115. Optionally, there is a hard mask 117 material remaining over the metal gate 115.

Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum and aluminum. The high-k material can be deposited by any suitable process, including but not limited to, atomic layer deposition (ALD), molecular layer deposition (MLD), chemical vapor deposition (CVD), plasma enhanced chemical vapor deposition (PECVD), high density plasma chemical vapor deposition (HDPCVD), rapid thermal chemical vapor deposition (RTCVD), in-situ radical assisted deposition, ultrahigh vacuum chemical vapor deposition (UHVCVD), metalorganic chemical vapor deposition (MOCVD), molecular beam epitaxy (MBE), physical vapor deposition, sputtering, evaporation, ion beam deposition, electron beam deposition, laser assisted deposition, chemical solution deposition, or any combination of those methods. Preferably the deposition method is ALD. The high-k thickness may range from 0.5 to 3 nm, but is preferably 10-20 Angstroms.

Suitable metal gate materials can include, but are not limited to, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material can further comprise dopants that are incorporated during or after deposition. Preferably, the metal gate includes a bottom layer of titanium nitride followed by a polysilicon layer. On top of the polysilicon layer, there can be a hardmask 117. The hardmask preferably is, or at least contains, a silicon oxide ($SiO_x$) though a variety of insulating materials could be used singularly or in combination. A film containing silicon and nitrogen are also suitable as hardmasks. Suitable processes described above for high-k deposition can be used for forming the metal gate. The thickness of the metal gate may range from 10 nm to 100 nm. In an exemplary embodiment the thickness of the titanium nitride layer is about 10 nm and the thickness of the polysilicon layer is about 40 nm-50 nm. The hardmask 117, as deposited, is about 20 nm, but can be from about 0 nm-10 nm after etching the gate stack.

The overall height of the gate stack (high-k 110 plus metal gate 115) may range from 10 nm to over 100 nm. It is preferred that the overall gate stack height exceeds the fins by about 15 nm to 40 nm. In an exemplary embodiment, at block 20, the overall height of the gate stack is about 50 nm to about 60 nm and exceeds the height of the fins 105 by about 20 nm to 30 nm.

Figure 3A:
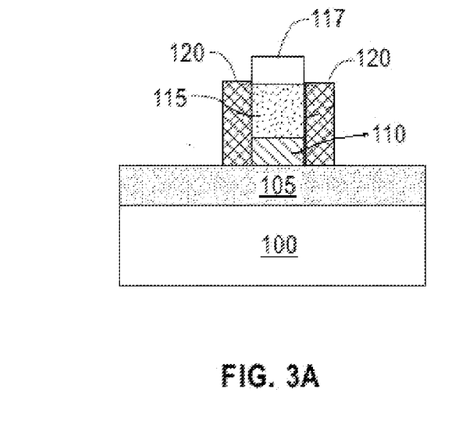
FIG. 3A illustrates a cross section of a MOSFET after an off-set spacer is formed according to an embodiment of the disclosure. The cross-section along the y-axis following a fin as it goes under the gate stack.
Figure 3B:
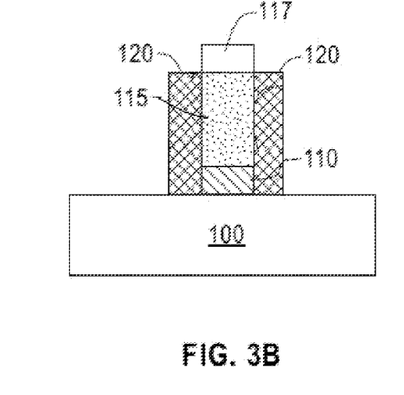
FIG. 3B illustrates a cross section of a MOSFET after an off-set spacer is formed according to an embodiment of the disclosure. The cross-section is through the gate-stack along the y-axis according to an embodiment of the invention.

Referring to FIGS. 3A and 3B, an off-set spacer 120 is formed adjacent to the gate stack. To form an off-set spacer 120, a film is deposited over the entire surface of the substrate and then is etched anisotropically, meaning the horizontal surfaces etch faster than the vertical surfaces. In addition, the pitch and height of the fins allow the vertical sidewalls of the fins to be etched faster than the vertical sidewalls of the gate stack. Thus, the spacer material is left on the sidewall of the gate stack while it is largely removed from other surfaces. As a result, off-set spacers 120 are formed on the vertical sidewalls of the gate stack.

In FIGS. 3A and 3B the cross-sections show the sidewall of the gate stack (i.e., sidewalls of the metal gate 115 and high-k material 110); accordingly, the off-set spacer 120 can be seen in these cross-sections. The off-set spacer 120 is adjacent to the metal gate 115 and vertical sidewalls of the high-k material 110. Some residual off-set spacer material 120 may be left on top of the metal gate or on top of any remaining hard mask material 117, however, residual material is not shown in the figures.

As deposited, the off-set spacer material is from about 40 Angstroms to 80 Angstroms and ranges there between, and more specifically about 60 Angstroms. After material is etch, the off-set spacer can be up to 50 Angstroms at its widest point.

Off-set spacer 120 can be formed from silicon oxide, silicon nitride, silicon carbide, silicon oxynitride, silicon carbonnitride and is preferably a silicon nitride film. Off-set spacer 120 can be deposited using a variety of techniques physical vapor deposition, chemical vapor deposition and atomic layer deposition. The off-set spacer material is etched by reactive ion etching (RIE) with fluorine-based chemistries such as, but not limited to, $CH_2F_2$, $CHF_3$, $CF_4$, $NF_3$, or a combination of fluorine-based chemistries.

After the off-set spacers 120 are formed, an epi-merge layer is formed. Initially, the fins 105 are discrete structures; however, an epitaxial film of the same material as the fins 105 is grown on the fins 105. As growth continues, the fins become wider and wider until the individual fins 105 grow together. Thus, the merged fins form one large epi-merged layer 105'. The growth process can include an etching component such that growth on the top of the fins 105 is removed preferentially to localize growth on the sidewalls of the fins 105. With such a process, the fins merge laterally without growing too much vertically, if at all.

Figure 4:
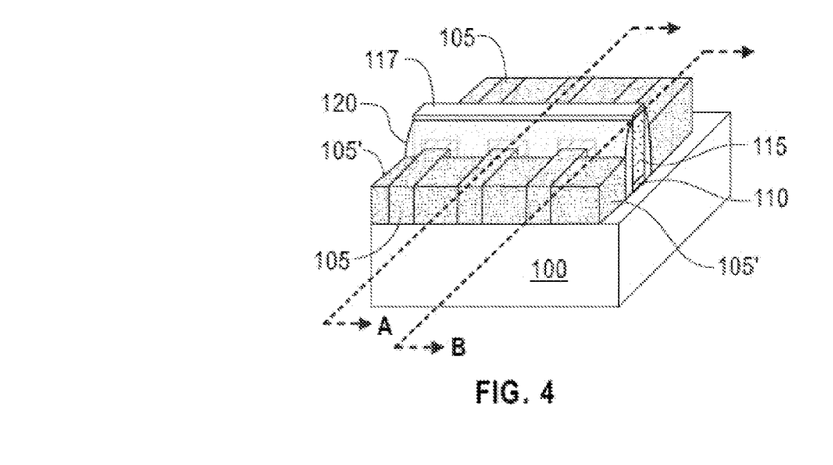
FIG. 4 illustrates a cross section of a MOSFET after an epi-merge layer is formed according to a method step in an embodiment of the disclosure. Dotted lines represent cross sections along the y-axis further illustrated in FIGS. 4A and 4B.

Referring to FIG. 4 the epi-merge layer 105' is shown to be about the same height as the original fin 105, though the height can vary so long as the top of the epi-merge layer 105' is lower than the top of the gate stack. While the fins 105 not covered by the gate stack are, in reality, largely indistinguishable from the epi-merge layer 105' they are shown in FIG. 4 for reference purposes. Since the epi-merge layer 105' only forms on the exposed portion of the fins 105, the portion of the fins 105 under the gate stack (high-k 110 and metal gate 115) cannot merge laterally and remain under the gate stack.

Figure 4A:
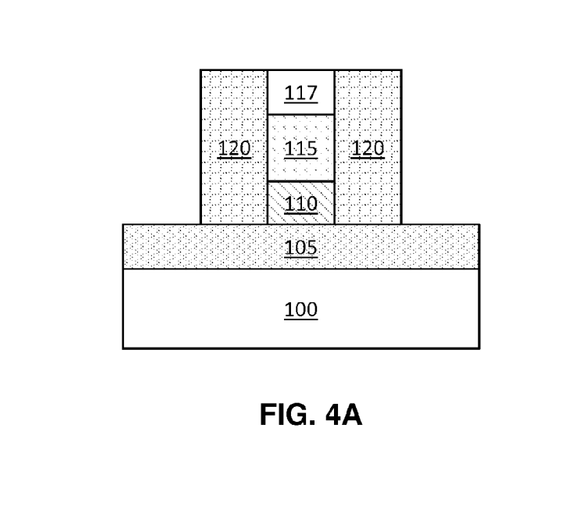
FIG. 4A illustrates a cross section of a MOSFET after an epi-merge layer is formed according to an embodiment of the disclosure. The cross-section along the y-axis following a merged fin as it goes under the gate stack.
Figure 4B:
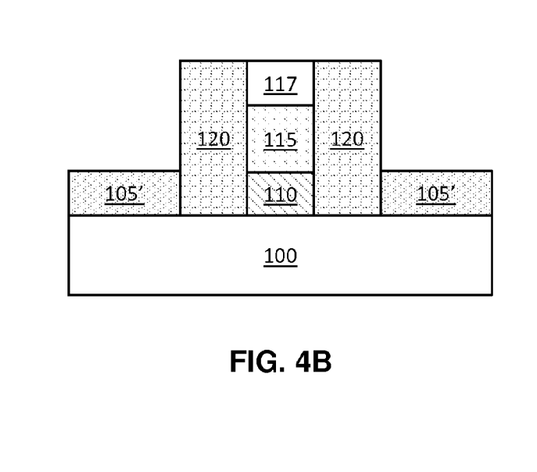
FIG. 4B illustrates a cross section of a MOSFET after an epi-merge layer is formed according to an embodiment of the disclosure. The cross-section is through the gate-stack along the y-axis according to an embodiment of the invention.

In FIG. 4A the cross-section is along the y-axis and through a fin 105. Even though the merge process makes the epi-merge layer 105' largely indistinguishable from the fin 105, the cross section shown in FIG. 4A labels the fin 105, for reference purposes only. It would also be correct to label the area not under the gate stack as an epi-merge layer 105' because it is now part of the epi-merge region. In FIG. 4B, the cross-section is also along the y-axis, but this time through the epi-merge layer 105' rather than the original fin 105. Therefore, the epi-merge material is labeled 105'. After the epi-merge layer 105' is formed, the layer can be implanted with dopants to form the source and drains (herein S/D) of the transistor by using convention methods and materials.

Figure 5A:
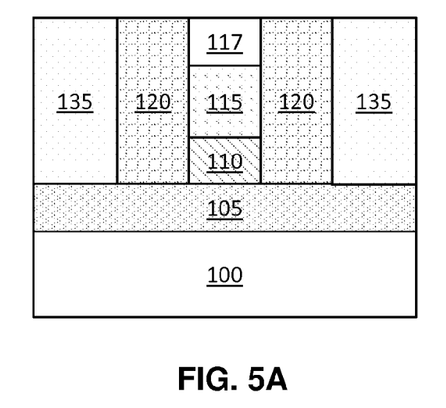
FIG. 5A illustrates a cross section of a MOSFET after a field oxide layer is formed according to an embodiment of the disclosure. The cross-section along the y-axis following a merged fin as it goes under the gate stack.
Figure 5B:
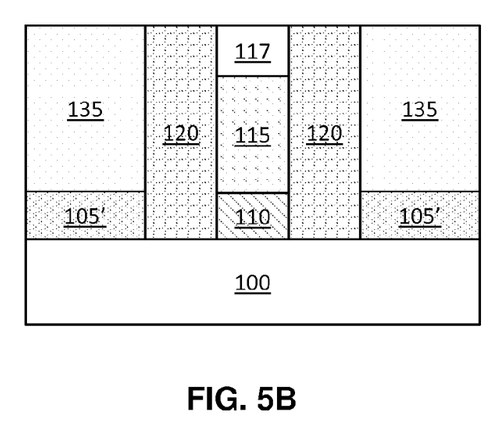
FIG. 5B illustrates a cross section of a MOSFET after a field oxide layer is formed according to an embodiment of the disclosure. The cross-section is through the gate-stack along the y-axis according to an embodiment of the invention.

Referring to FIGS. 5A and 5B, making a FinFET with recessed epi-merge region involves forming a field oxide layer 135. To form the field oxide layer 135, a film is deposited over the entire surface of the substrate and then is etched anisotropically, meaning the horizontal surfaces etch faster than the vertical surfaces. Thus, the field oxide layer 135 material is left on the sidewall of the off-set spacer 120 while it is largely removed from other surfaces. As a result, field oxide layer 135 are formed adjacent the vertical sidewalls of the metal gate 115 which are, in turn, covered by off-set spacers 120.

FIGS. 5A and 5B cross-sections show the sidewall of the gate stack (i.e., sidewalls of the metal gate 115 and high-k material 110); accordingly, the field oxide layer 135 can be seen in these cross-sections. The field oxide layer 135 is adjacent to the metal gate 115 and in one embodiment, has the off-set spacer 120 intervening between field oxide layer 135 and metal gate 115. After the field oxide layer 135 is formed, the epi-merge layer 105' is covered by the field oxide layer 135. While some residual field oxide material may be left on top of the metal gate or on top of any remaining hard mask material 117. As residual material is not a preferred embodiment, it is not shown in the figures.

Field oxide layer 135 can be formed from silicon oxide, silicon carbide, silicon nitride, silicon oxynitride and silicon carbonitride with tensile stress for NFET and similarly for PFET, silicon oxide, silicon carbide, silicon nitride, silicon oxynitride and silicon carbonitride films with compressive stress can be used. Preferably silicon nitride with tensile stress is used for NFET and silicon nitride with compressive stress is used for PFET device. The thickness of the field oxide layer 135 can be from about 20 nm to about 100 nm and ranges there between, and more specifically about 50 nm. The stress liner material can be deposited by a variety of methods including physical vapor deposition, chemical vapor deposition and atomic layer deposition.

Figure 6A:
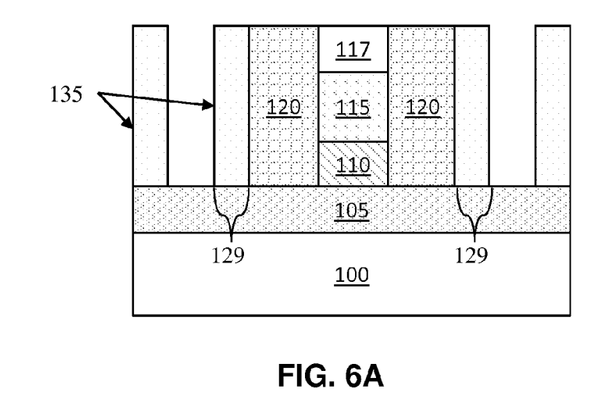
FIG. 6A illustrates a cross section of a MOSFET after recessing the field oxide layer according to an embodiment of the disclosure. The cross-section along the y-axis following a merged fin as it goes under the gate stack.
Figure 6B:
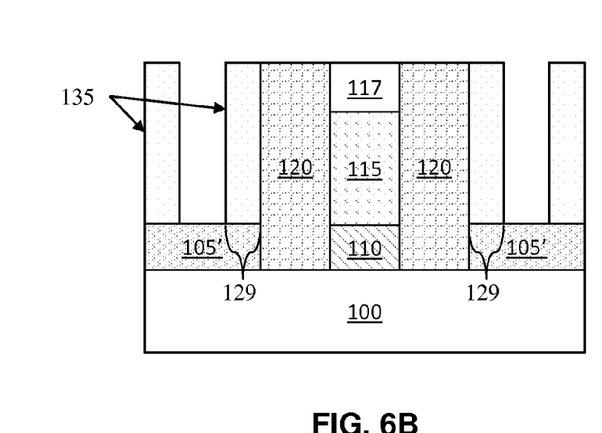
FIG. 6B illustrates a cross section of a MOSFET after recessing the field oxide layer according to an embodiment of the disclosure. The cross-section is through the gate-stack along the y-axis according to an embodiment of the invention.

Referring to FIGS. 6A-6B, making a FinFET with recessed epi-merge region involves removing a portion of the field oxide layer 135 to expose a portion of the epi-merge layer 105, 105'. In exemplary embodiments, the removal process starts with a litho process for patterning and after a local interconnect for contact is defined, a portion of the field oxide layer 135 is etched to make a trench on top of the epi-merger layer 105. In exemplary embodiments, after the portion of the field oxide layer is removed an epi-merge spacer region 129 is formed. The epi-merge spacer region 129 is a portion of the epi-merge layer 105' that will not be etched because it is protected by the field oxide layer 135. Thus, the epi-merge spacer region 129 has a height roughly equal to the height of fin 105 which is approximately equal to the height of original epi-merge layer 105'.

Figure 7A:
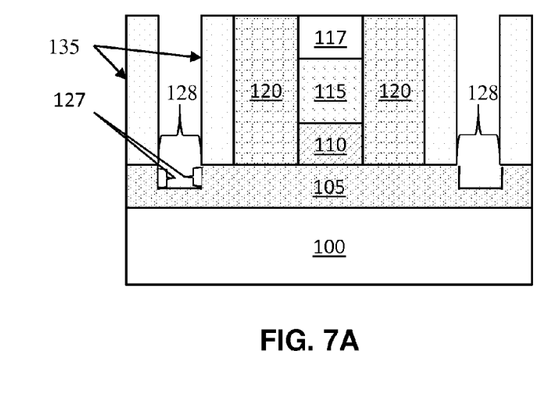
FIG. 7A illustrates a cross section of a MOSFET after recessing an epi-merge layer according to an embodiment of the disclosure. The cross-section along the y-axis following a merged fin as it goes under the gate stack.
Figure 7B:
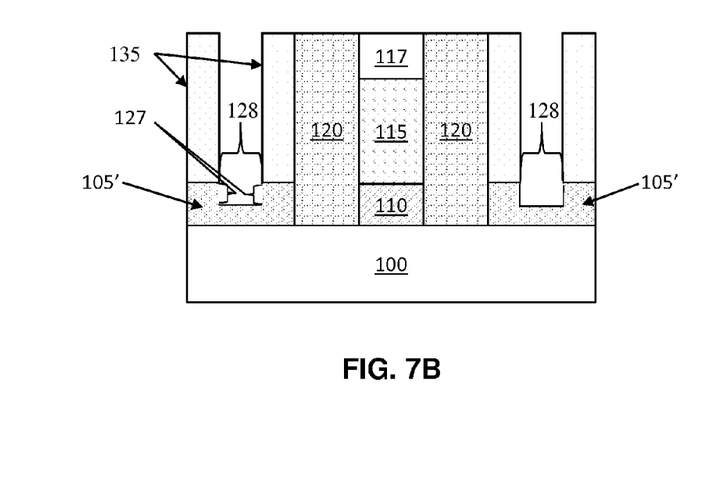
FIG. 7B illustrates a cross section of a MOSFET after recessing an epi-merge layer according to an embodiment of the disclosure. The cross-section is through the gate-stack along the y-axis according to an embodiment of the invention.

Referring to FIGS. 7A-7B, forming a FinFET with recessed epi-merge region involves removing a portion of the epi-merge layer 105, 105' to form an epi-merge field region 128 and epi-merge sidewalls 127. The epi-merge field region 128 is the exposed portion of epi-merge layer 105' remaining after the recess etch. The epi-field region 128 thickness can vary. The field region 128 thickness can be as little as 5 nm, and more specifically about 15 nm to about 20 nm. The epi-merge sidewalls 127 are formed as a result of etching the exposed portion of the epi-merge layer 105' while the portion of the epi-merge layer 105' under the field oxide layer 135 is protected from etching. The epi-merge sidewalls are roughly vertical (i.e., perpendicular to the substrate) and are from about 10 nm to about 25 nm high and ranges there between.

After recessing the epi-merge layer 105', an epi-merge field region 128 and an epi-merge sidewalls 127 are formed and exposed, while an epi-merge spacer region 129 is covered by field oxide layer 135.

Figure 8A:
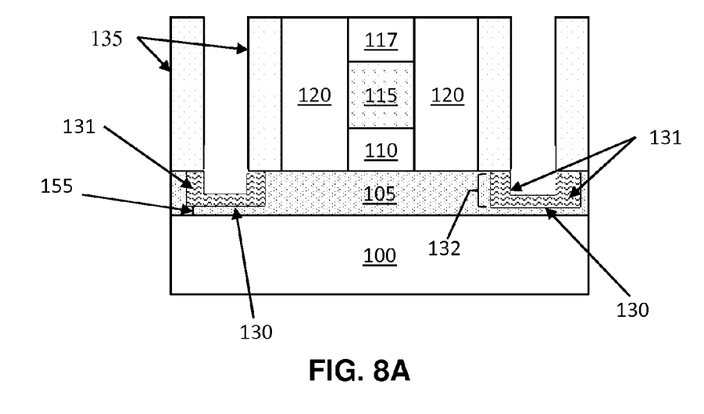
FIG. 8A illustrates a cross section of a MOSFET after a vertical silicide is formed according to an embodiment of the disclosure. The cross-section along the y-axis following a merged fin as it goes under the gate stack.
Figure 8B:
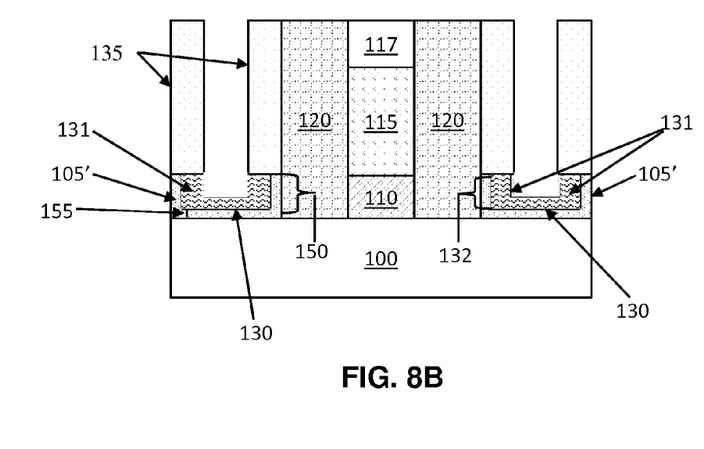

In FIGS. 8A and 8B the cross-sections show a silicide layer 130 on the epi-merge field region 128 and silicide sidewalls 131 on the epi-merge sidewalls 127. In exemplary embodiments, the silicide layer 130 and silicide sidewalls 131 can be formed by depositing a metal film and then heating it so that it reacts with the epi-merge field region 128 and epi-merge sidewalls 127. Suitable metal materials include cobalt, nickel, tungsten, platinum, erbium or ytterbium. A particularly suitable metal is nickel and, accordingly, the resulting silicide is a nickel silicide. The thickness of the as deposited metal is from about 10 nm to about 50 nm. As the substrate with the deposited metal is heated to a temperature in the range of from about 200 C to about 600 C and ranges there between.

During formation of the silicide layer 130, a portion of the epi-merge field region 128 may be consumed. As a result, the thickness of the silicide layer 130 can be about 5 nm to about 30 nm and is preferably about 10 nm, while the remaining, unconsumed, epi-merge field region 128 thickness 155 can range from about 0 nm to about 15 nm and ranges therebetween, and is preferably 5 nm (See FIGS. 8A and 8B). Similarly, during formation of the silicide sidewalls 131, a portion of the epi-merge sidewall 127 can be consumed. As a result, the thickness of the sidewall silicide 131 can be about 5 nm to about 30 nm and is preferably about 10 nm. The distance between the sidewall silicide 131 and the gate stack sidewall is from about 10 nm to about 50 nm and ranges there between, and more specifically about 20 nm. It should be noted, that the sidewall silicide 131 can be thinner than the silicide layer 130 in the epi-merge field region 128.

Referring again to FIG. 8A, it should be noted that the silicide layer 130 forms horizontally along the epi-merge field region 128. Furthermore, silicide forms along the epi-merge sidewalls 127 to form silicide sidewalls 131 having a silicide sidewall height 132. As shown in FIG. 8A, the height 132 of the silicide sidewalls 131 are measured from the bottom of the silicide/epi-merge field region interface and up to the silicide adjacent the top of the epi-merge spacer region 129. In other embodiments in which the silicide process consumes the epi-merge field region 128, the height 132 of the silicide sidewall 131 is measured from the bottom of the silicide/substrate buried insulator 100 interface and up to the silicide adjacent the top of the epi-merge spacer region 129. The height 132 of the sidewall silicide 131 can be 5 nm to about 50 nm and ranges there between. As shown in FIG. 8B, the height 150 of the epi-merge spacer region 129 can range from about 10 nm to about 80 nm and ranges there between, and more specifically from about 30 nm to about 50 nm and ranges there between.

In exemplary embodiments, a FinFET formed in accordance with the method describe above includes a source and a drain. The source and drains are formed in step 40, after the fins 105 were merged to form the epi-merge layer 105'. As a result, the source/drains include the epi-merge-field region 128 and the epi-merge-spacer region 129. Those skilled in the art will recognize that a portion of the source/drains may also extend under the off-set spacer 120. The region of the fin 105 between the source/drains and near the high-k layer 110 is called the channel. The channel position (meaning its length) can vary depending on the doping. The gate stack is located above the channel and includes the high-k layer 110 and metal gate 115. Finally, because the source/drain includes the epi-merge-field region 128 and epi-merge-sidewall 127, a silicide layer (including the field silicide 130 and the sidewall silicide 131) is defined on the source and drain wherein in a portion of the silicide layer (sidewall silicide 131) is perpendicular to the channel.

An advantage of the recessed epi-merge region in an embodiment of the disclosure is that a vertical silicide structure including a silicide layer and sidewalls can be formed. The silicide sidewalls of the vertical silicide structure are vertical with respect to the wafer surface, meaning the silicide sidewalls are perpendicular to the wafer surface. By being vertical, the silicide is also formed in the plane of the channel, and thus reduces spreading resistance. Spreading resistance is the resistance a carrier experiences while traveling through the source or drain region and typically is 200 to 300 ohm-μm, however, in the present embodiments, resistance is reduced by 50-100 ohm-μm.

As FinFETs continue to be made smaller the horizontal space available for the silicide used for the source and drain also continues to decrease. As a result, the contact resistance of the silicide contacts will increase. Accordingly, another advantage of the disclosure is that the contact resistance of the silicide structure is reduced be effectively lengthening the contact surface area of the silicide structure with the epi-merge layer. In exemplary embodiments, the contact surface area of the vertical silicide structure is twice the height of the silicide sidewalls and the length of the silicide layer 130.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. In particular, various combinations of off-set spacer use (or not), raised source drain use (or not), and full or partial refill of the recess are within the scope of specification. The scope of the following claims is to be accorded the broadcast interpretation so as to encompass all such modifications and equivalent structures and functions.

What is claimed is:

1. A method of forming a MOSFET, comprising:
    providing a substrate with a plurality of fins;
        forming a gate stack above the substrate wherein the gate stack has at least one sidewall;
    forming an off-set spacer adjacent the gate stack sidewall;
        growing an epitaxial film which merges the fins to form an epi-merge layer;
        forming a field oxide layer adjacent to at least a portion of the off-set spacer;
        removing a portion of the field oxide layer to expose a portion of the epi-merge-layer;
        removing a portion of the exposed portion of the epi-merge-layer to form an epi-merge sidewall, an epi-merge spacer field region, and an epi-merge field region, wherein the epi-merge field region includes a remaining portion of the exposed portion of the epi-merge-layer that was not removed; and
        forming a silicide within the epi-merge sidewall to form a silicide layer and two silicide sidewalls.

2. The method of claim 1, wherein the field oxide layer is formed directly on the epi-merge layer.

3. The method of claim 1, further comprising:
    forming a silicide with the epi-merge field region to form a field silicide.

4. The method of claim 1, further comprising:
    implanting the fins with a dopant to from doped extensions under the off-set spacer.

5. The method of claim 1, further comprising:
   implanting the epi-merge layer with a dopant to create a source and a drain.

6. The method of claim 1, wherein the two silicide sidewalls are perpendicular to the substrate.

* * * * *